United States Patent [19]
Lin

[11] Patent Number: 5,584,705
[45] Date of Patent: Dec. 17, 1996

[54] ELECTRICAL CONNECTOR SOCKET WITH CARD EJECTOR

[75] Inventor: Audy Lin, Taipei, Taiwan

[73] Assignee: Tekcom Electronics Corp., Taipei Hsien, Taiwan

[21] Appl. No.: 562,513

[22] Filed: Nov. 24, 1995

[51] Int. Cl.$^6$ .................................................. H01R 13/62
[52] U.S. Cl. .......................................................... 439/157
[58] Field of Search ................................... 439/157, 160, 439/328, 636, 637

[56] References Cited

U.S. PATENT DOCUMENTS

| | | | |
|---|---|---|---|
| 5,163,847 | 11/1992 | Regnier | 439/157 |
| 5,211,568 | 5/1993 | Yamada et al. | 439/157 |
| 5,273,447 | 12/1993 | Heiney et al. | 439/160 |
| 5,364,282 | 11/1994 | Tondreault | 439/157 |
| 5,387,115 | 2/1995 | Kozel et al. | 439/157 |
| 5,389,000 | 2/1995 | DiViesti et al. | 439/157 |
| 5,470,240 | 11/1995 | Suzuki | 439/160 |

Primary Examiner—Neil Abrams
Assistant Examiner—Brian J. Biggi
Attorney, Agent, or Firm—Browdy and Neimark

[57] ABSTRACT

An electric connector includes an insulated seat and multiple pairs of terminals fixably mounted therein. Each terminal has a V-shaped bent contact portion at an inner side thereof and an S-shaped bent portion at a lower end thereof, which is connected to a leg for insertion into a circuit board and projecting therefrom. The configuration of the contact portion and bent portion of the terminal provides a greater resilience and a greater force for holding an insertable card in the seat. The electric connector further has a couple of hooks disposed at opposite ends thereof. The hooks are pivotally connected to the seat by means of pins. Each hook is provided with a push portion at a lower end thereof and a retaining portion at an upper end thereof, such that when an insertable card is plugged into the seat, the hook may retain notches in the sides of the card to enhance the gripping effect. The card may be easily removed from the seat by pressing an upper end of the hook so that the push portion pushes the card upwardly to disengage from the seat.

1 Claim, 5 Drawing Sheets

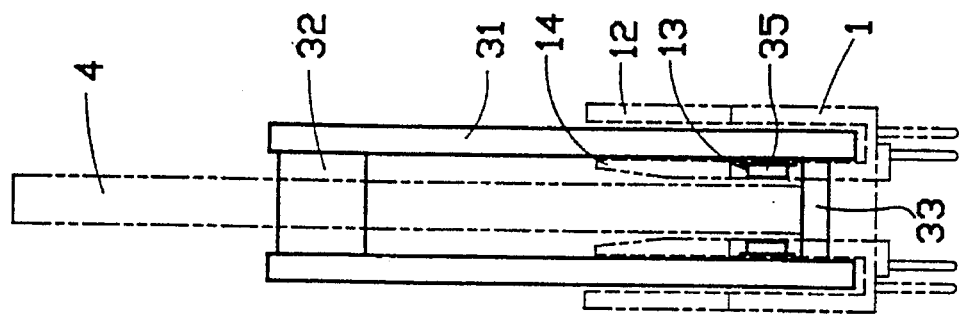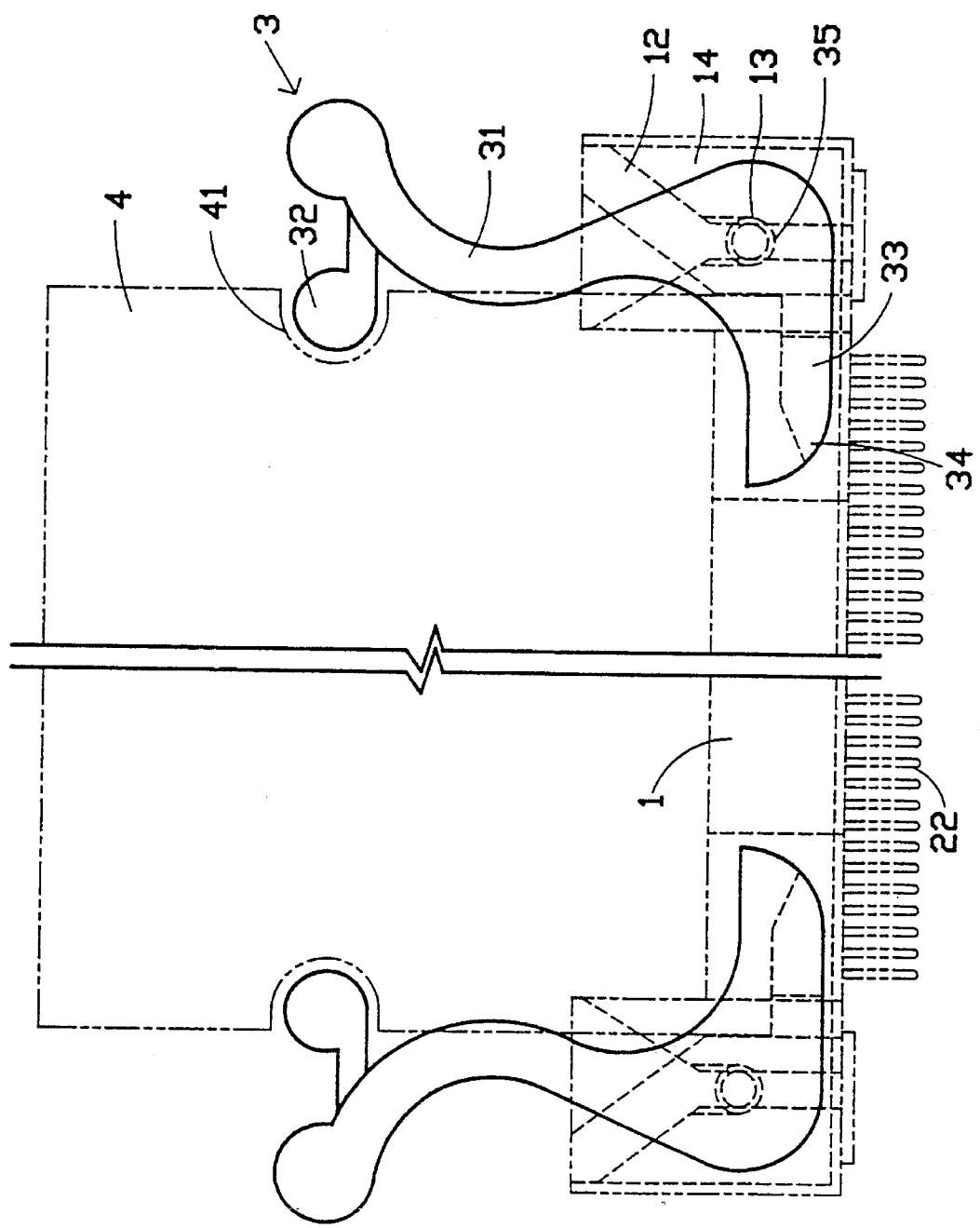

5,584,705

ELECTRICAL CONNECTOR SOCKET WITH CARD EJECTOR

BACKGROUND OF THE INVENTION (1) Field of the Invention

The present invention relates generally to an electric connector, and more particularly to an electric connector for insertion therein insertable cards such as interface cards, the electric connector having the advantages of providing good resilience and a greater securing force, accepting cards of greater thickness, reducing resistance during insertion of the cards, good positioning of the inserted cards, and easy separation of the cards from the connector.

(2) Description of the Prior Art

A conventional electric connector comprising an insulated seat 1 and multiple pairs of terminals 2, the number of which depending on the applications of the connector,is shown in FIG. 1. In this figure, only a pair of terminals 2 are shown. Each terminal 2 is fixedly disposed in the seat 1 and has a contact portion 21 at an inner side thereof, which is exposed within an insert slot 11 of the seat 1 to facilitate connection with insertable cards such as interface cards. The terminal 2 has a plurality of legs 22 at a lower end thereof, which project from a bottom side of the seat 1 for insertion into a circuit board, achieving connection of the cards and the circuit board.

However, in the prior art, the contact portion 21 of the terminal 2 is configured to be a mere curved shape which does not have good resilience and force, so that the card may not be firmly secured thereby, and the connector cannot have a wider scope of application. Besides, the resistance will be comparatively greater when the card is inserted into the connector. Furthermore, if the terminals 2 are constantly subjected to the plugging in and pulling out of the cards, they will soon be damaged or will break so that the entire connector cannot be used, which is indeed uneconomical and inconvenient.

In addition, in order that the card may be firmly held in the connector of the prior art, the holding space is very narrow so that it is difficult and inconvenient to remove the card therefrom.

SUMMARY OF THE INVENTION

According to one aspect of the invention, an electric connector is provided with multiple pairs of terminals having V-shaped bent contact portions, each of which has a lower end thereof extending to form an S-shaped bent portion, which is in turn connected to a leg, such that the connector of the invention has a better resilience and greater holding force to more securely hold an insertable card with reduced resistance and may accept cards of a greater thickness. Resistance upon cards may also be reduced as well.

According to another aspect of the invention, an electric connector has a couple of hooks provided at opposite ends thereof for pivotal connection with a couple of hook seats disposed at both ends of a seat. Each hook has an upper retaining portion and a lower push portion. The retaining portions of the hooks are retained in corresponding notches formed in the sides of an insertable card plugged into a seat of the connector to enhance the gripping force. The card may be easily removed from the connector by pressing an upper end of the hooks so that the retaining portions are disengaged from the notches of the card, while the push portions below push the card upwardly to disengage from the seat of the connector.

BRIEF DESCRIPTION OF THE DRAWINGS

The foregoing and other features and advantages of the present invention will be more clearly understood from the following detailed description and the accompanying drawings, in which.

FIG. 5 is an elevational schematic view of the electric connector of the invention, and FIG. 6 is a side schematic view of the electric connector of the invention.

DETAILED DESCRIPTION OF THE PREFERRED EMBODIMENT

Figure 1:
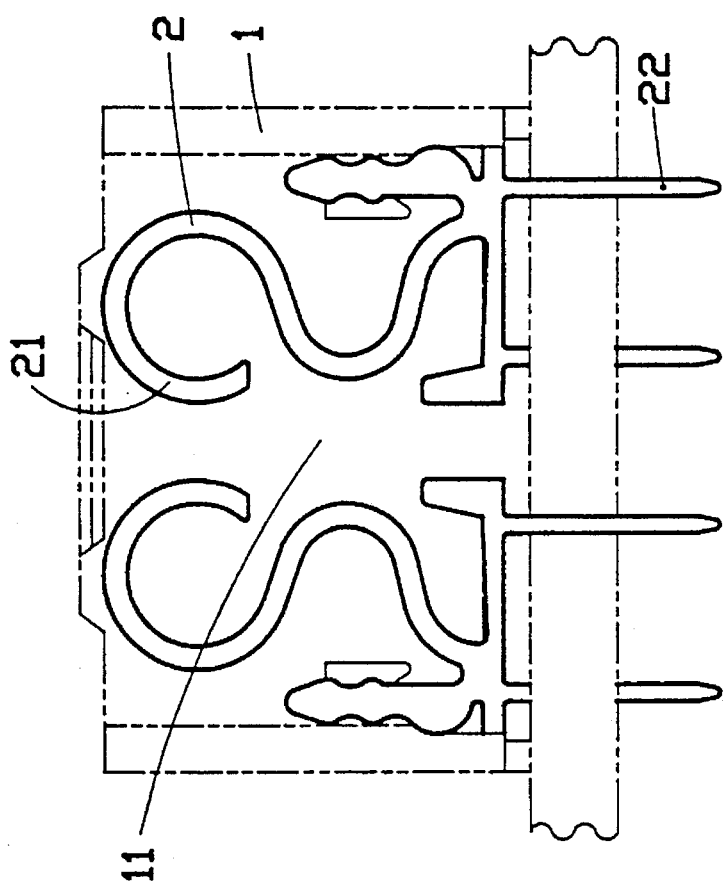
FIG. 1 is a sectional view of a prior electric connector.
Figure 2:
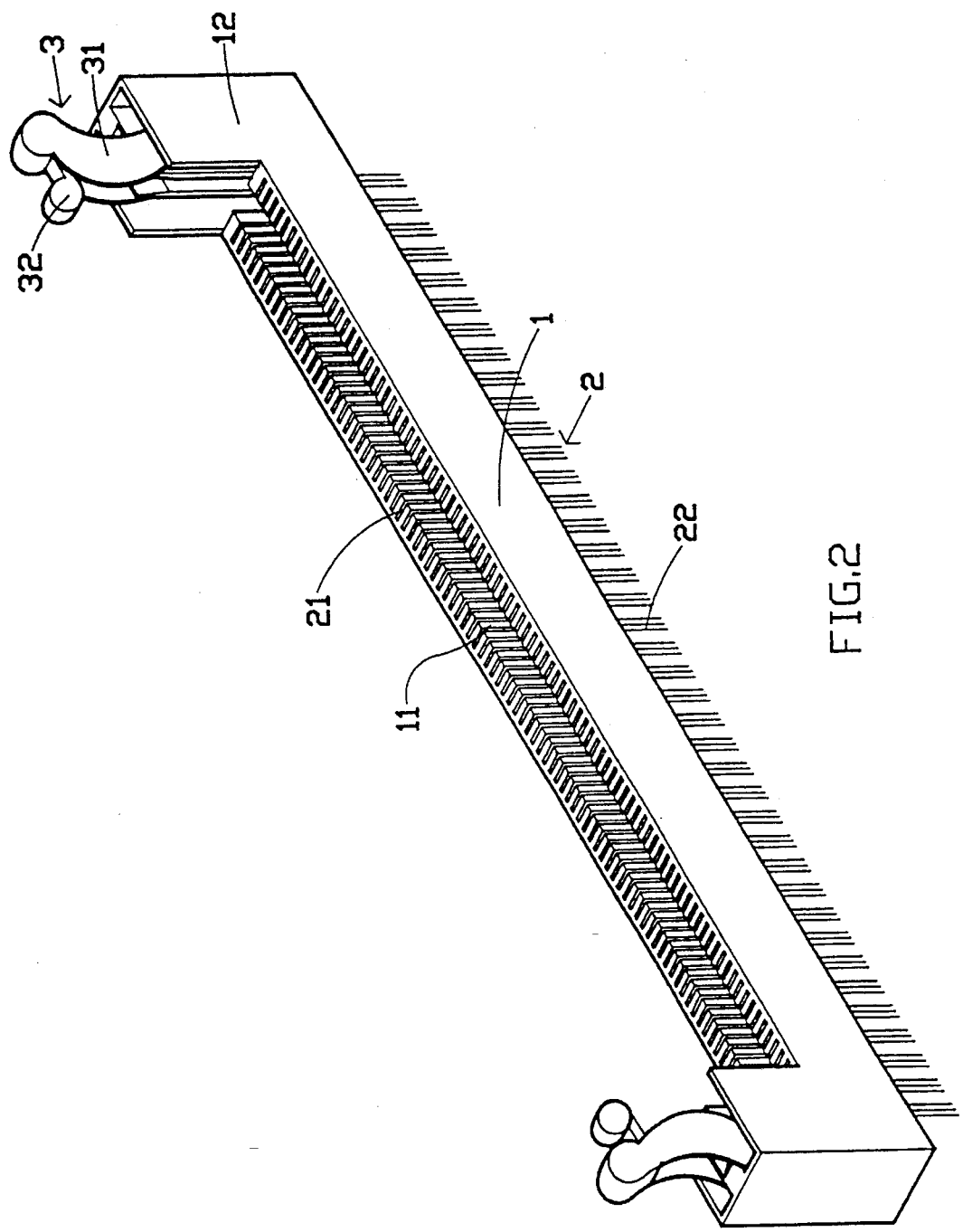
FIG. 2 is a perspective view of an electric connector of the invention.
Figure 3:
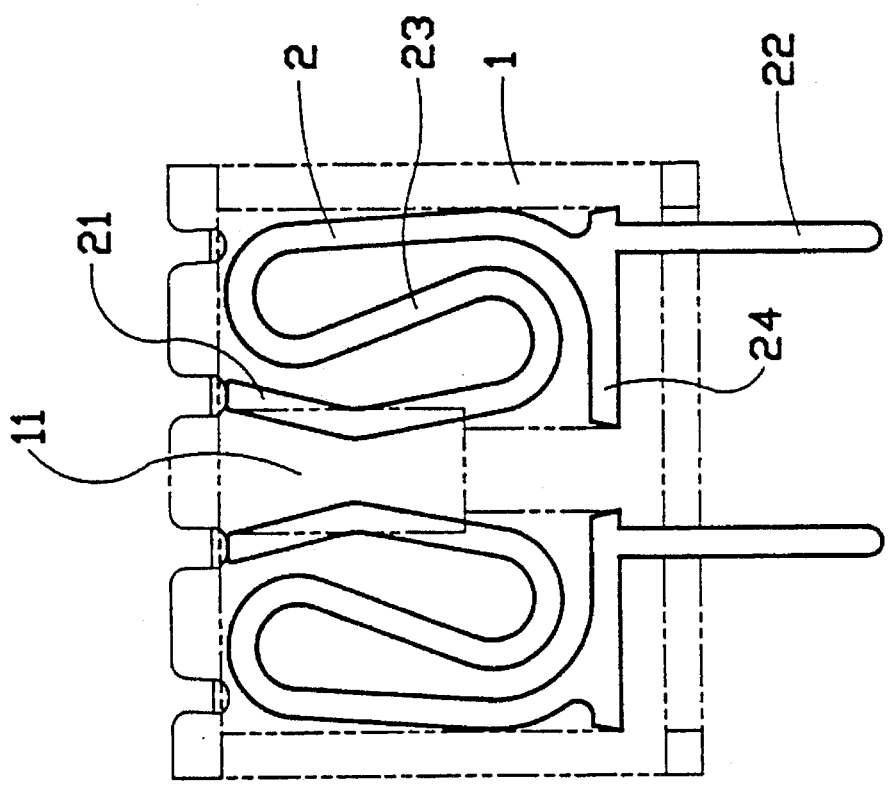
FIG. 3 is a sectional view of the electric connector of the invention.

With reference to FIGS. 2 and 3, the electric connector of the invention mainly comprises a seat 1 and multiple pairs of terminals 2. The number of the terminals 2 is not restricted. Since the pairs of terminals 2 are identical in structure, only one pair of terminals 2 will be described in detail herein. The seat 1 is formed of insulated material such as plastics and has an insert slot 11 with an upper opening in a central portion thereof for receiving insertable cards such as interface cards.

The terminals 2 are fixedly disposed in the seat 1. Each terminal 2 has a contact portion 21 at an inner side thereof. The contact portion 21 is bent into a "V" shape and projects towards the insert slot 11. The contact portion 2 has a lower end thereof extending to one side to form an S-shaped bent portion 23, which in turn has a lower end connected to a leg 22. Between the bent portion 23 and the leg 22 is a substantially horizontal mounting portion 24 which rests against an inner bottom side of the seat 1. The contact portion 21 is exposed in the insert slot 11 of the seat 1 to enable electrical connection after a card is inserted in the insert slot 11. The leg 22 is exposed on the outside of the seat 1 for insertion into a circuit board, achieving connection between the card and the circuit board.

Since the contact portions 21 of the terminals 2 are configured to be V-shaped and the bent portions 23 are S-shaped, they afford a greater resilience and a greater force than conventional curved contact portions so that the cards may be more securely held by the electrical connector of the invention and cards of a greater thickness may be acceptable. Besides, since the contact portion 21 has an upwardly inclining end portion, it may guide the card smoothly into the connection without much resistance.

Figure 4:
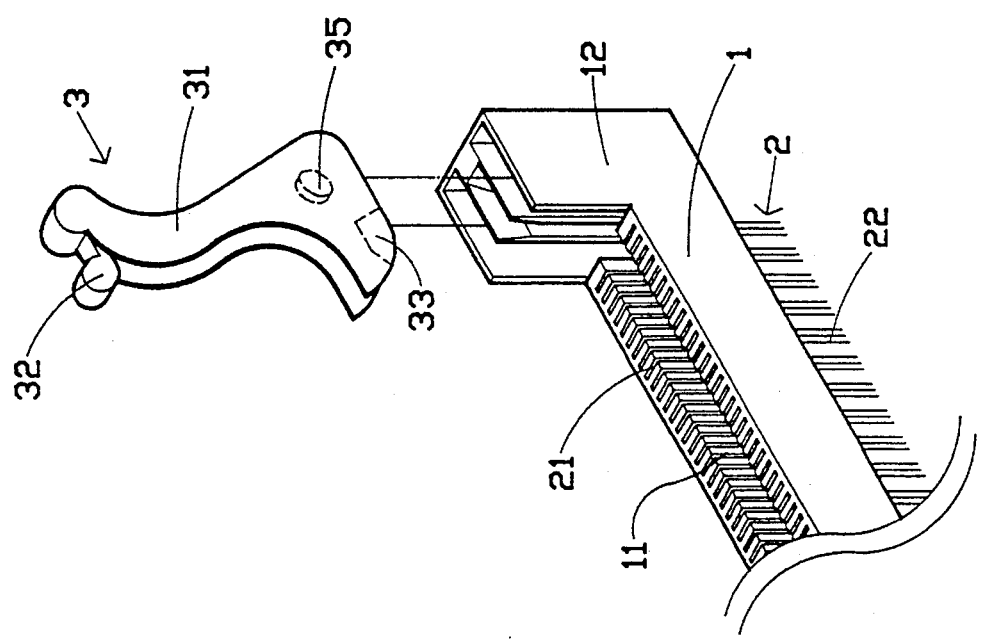
FIG. 4 is a perspective exploded view of the electric connector of the invention.

With reference to FIGS. 4, 5 and 6, the seat 1 has a pair of hooks 3 disposed individually at opposite ends thereof. These hooks are identical in construction; therefore, only one will be discussed in detail herein. The hook 3 consists of two hook bodies 31, a retaining portion 32 and a push portion 33. The hook bodies 31 are substantially L-shaped plates which are joined together as a whole by means of the retaining portion 32 and the push portion 33, which are respectively located at an upper end and a lower end of the hook bodies 31. The retaining portion 32 projects from the hook bodies 31 and is substantially cylindrical in shape. The push portion 33 has a pointed end 34. A circular pin 35 is disposed on an inner wall of the individual hook bodies 31 substantially above the push portion 33.

Furthermore, the seat 1 has a pair of hook seats 12 respectively disposed at either end thereof. The hook seats 12 are integrally formed with the seat 1 and are each provided with two plate-like inner seats 14 at the inner walls thereof. Each inner seat 14 is provided with a pivot hole 13 for matching the pin 35 of the hook 3. The pins 35 are fitted into the pivot holes 13 so that hook 3 may be pivotally connected to the seat 1 and the hook 3 may turn with the pin 35 as a pivot.

As shown in FIG. 5, when an insertable card 4 is inserted into the seat 1, the retain portions 32 of the hooks 3 may retain notches 41 pre-formed on the card 4 to more firmly grip the card 4. To remove the card 4, it is only necessary to press the top portion of the hooks 3 so that the upper end of the hooks 3 may turn with the pivot pins 35 so as to allow the retaining portions 32 to disengage from the notches 41 to release the force gripping on the sides of the card 4. At the same time, the push portions 33 at the lower end of the hooks may displace upwardly to push the bottom of the card 4 upwardly so that the card 4 may disengage from the seat 1 with ease.

Although the present invention has been illustrated and described with reference to the preferred embodiment thereof, it should be understood that it is in no way limited to the details of such embodiment but is capable of numerous modifications within the scope of the appended claims.

What is claimed is:

1. An electric connector comprising:

a seat formed of insulated material and having an insert slot with an upper opening in a central portion thereof for receiving an insertable card such as an interface card, said seat having a pair of hook seats respectively disposed at opposite ends thereof, each of said hook seats having a pair of walls spaced from and parallel to side walls of the seat;

each of said pair of wall having a pivot hole;

a multiplicity of terminals secured in said seat, each of said terminals having a contact portion at an inner side thereof, said contact portion having a lower end thereof extending to one side to form a substantially S-shaped bent portion which is in turn connected to a single vertical leg, said single vertical leg and said bent portion having a mounting portion disposed therebetween perpendicular to the single vertical leg, said mounting portion resting on a bottom side of the seat, each said contact portion projecting into said insert slot of said seat to form a V-shaped slot in each of said terminals, and said single vertical leg projecting from the bottom side of said seat;

a pair of hooks respectively disposed at both ends of said seat, each of said hooks comprising: a pair of hook bodies, a retaining portion and a push portion, said hook bodies being integrally connected by means of said retaining portion and said push portion, which are respectively disposed at an upper end and a lower end of said hook bodies, said retaining portion having an end projecting from said hook bodies, a circular pin being provided on each inner side of said hook bodies substantially above said push portion, each circular pin being respectively fitted into said pivot hole of each of said pair of walls, wherein said retaining portions of said hooks adapted to be respectively retained in a pair of oppositely disposed notches formed in both sides of an interference card, and an upper end of said hooks being rotatable around said circular pins so that when pressing of top portions of said hooks the retaining portion is disengaged from the notches in the interface card, and said push portion urges the card upwardly to cause it to disengage from said seat.

\* \* \* \* \*